United States Patent
Han et al.

(10) Patent No.: US 11,355,163 B2
(45) Date of Patent: Jun. 7, 2022

(54) MEMORY INTERCONNECTION ARCHITECTURE SYSTEMS AND METHODS

(71) Applicant: Alibaba Group Holding Limited, Grand Cayman (KY)

(72) Inventors: Wei Han, Sunnyvale, CA (US); Shuangchen Li, Sunnyvale, CA (US); Lide Duan, Sunnyvale, CA (US); Hongzhong Zheng, Los Gatos, CA (US); Dimin Niu, Sunnyvale, CA (US); Yuhao Wang, Sunnyvale, CA (US); Xiaoxin Fan, Sunnyvale, CA (US)

(73) Assignee: Alibaba Group Holding Limited, Grand Cayman (KY)

(*) Notice: Subject to any disclaimer, the term of this patent is extended or adjusted under 35 U.S.C. 154(b) by 0 days.

(21) Appl. No.: 17/037,134

(22) Filed: Sep. 29, 2020

(65) Prior Publication Data
US 2022/0101887 A1    Mar. 31, 2022

(51) Int. Cl.
*G11C 5/06*      (2006.01)
*G11C 11/4094*   (2006.01)
*G11C 11/408*    (2006.01)

(52) U.S. Cl.
CPC .......... *G11C 5/063* (2013.01); *G11C 11/4085* (2013.01); *G11C 11/4087* (2013.01); *G11C 11/4094* (2013.01)

(58) Field of Classification Search
CPC ....................................... G11C 5/063
USPC ........................................ 365/63
See application file for complete search history.

(56) References Cited

U.S. PATENT DOCUMENTS

| | | |
|---|---|---|
| 5,933,364 A | 8/1999 | Aoyama et al. |
| 6,818,957 B2 | 11/2004 | Hasegawa |
| 7,193,239 B2 | 3/2007 | Leedy |
| 7,883,964 B2 | 2/2011 | Goda et al. |
| 8,178,909 B2 | 5/2012 | Venkatraman |
| 8,541,819 B1 | 9/2013 | Or-Bach et al. |
| 8,659,136 B2 | 2/2014 | Youn et al. |
| 9,099,526 B2 | 8/2015 | Or-Bach et al. |
| 9,691,782 B1 | 6/2017 | Hwang |
| 10,014,346 B2 | 7/2018 | Nitta et al. |
| 10,074,605 B2 | 9/2018 | Liaw |
| 10,535,658 B2 | 1/2020 | Singh et al. |
| 2004/0262768 A1 | 12/2004 | Cho et al. |
| 2005/0162933 A1* | 7/2005 | Madurawe ....... H03K 19/17704 365/189.05 |

(Continued)

FOREIGN PATENT DOCUMENTS

WO    2019079625    4/2019

*Primary Examiner* — Hoai V Ho (57) ABSTRACT

The systems and methods are configured to efficiently and effectively include processing capabilities in memory. In one embodiment, a processing in memory (PIM) chip a memory array, logic components, and an interconnection network. The memory array is configured to store information. In one exemplary implementation the memory array includes storage cells and array periphery components. The logic components can be configured to process information stored in the memory array. The interconnection network is configured to communicatively couple the logic components. The interconnection network can include interconnect wires, and a portion of the interconnect wires are located in a metal layer area that is located above the memory array.

20 Claims, 10 Drawing Sheets

(56) References Cited

U.S. PATENT DOCUMENTS

| | | |
|---|---|---|
| 2005/0287793 A1 | 12/2005 | Blanchet et al. |
| 2007/0173012 A1 | 7/2007 | Aoki |
| 2009/0026618 A1 | 1/2009 | Kim et al. |
| 2017/0293512 A1* | 10/2017 | Yan .................. G06F 13/28 |
| 2018/0301506 A1 | 10/2018 | Murooka |
| 2018/0337121 A1 | 11/2018 | Liaw |
| 2019/0057979 A1 | 2/2019 | Lu |
| 2019/0130998 A1* | 5/2019 | van Rooyen .......... G16B 30/00 |
| 2019/0287995 A1 | 9/2019 | Oike et al. |
| 2020/0002789 A1 | 1/2020 | Zhu |
| 2020/0006371 A1 | 1/2020 | Huo et al. |
| 2020/0051945 A1 | 2/2020 | Pan et al. |

* cited by examiner

MEMORY INTERCONNECTION ARCHITECTURE SYSTEMS AND METHODS

FIELD OF THE INVENTION

The present invention relates to the field of information processing and communication in a memory.

BACKGROUND OF THE INVENTION

Numerous electronic technologies such as digital computers, calculators, audio devices, video equipment, and telephone systems facilitate increased productivity and cost reduction in analyzing and communicating data and information in most areas of business, science, education, and entertainment. Electronic components can be used in a number of important applications (e.g., medical procedures, vehicle aided operation, financial applications, etc.) and frequently these activities involve storing large amounts of information. Storing and retrieving the information can have significant impacts on system performance. The efficiency and effectiveness of memory storage operations can depend upon the configuration of memory being utilized.

Some conventional systems attempt to add processing capabilities to the memory. There are a number of factors that can impact the configuration of memory. Denser components are typically desired but the ability to get smaller components in the same semiconductor area (e.g., according to Moore's law, etc.) has significantly slowed down. In addition, significant amounts of energy are consumed during access operations by implementations with a dedicated processor (e.g., CPU, GPU, etc.) and separate memories as compared to lower energy consumption in implementations with processing in memory (PIM) capabilities. Two-dimensional processing in memory capabilities (2D PIM) typically reduces the memory access latency, the energy on data movement, and manufacture cost.

There are also a number of challenges when attempting to add processing capabilities to memory. The frequency and performance of 2D PIM is significantly limited by the wiring/routing resource due to the DRAM processing. DRAM arrays occupy significant area in PIM but don't typically use the top metal layers (e.g., primarily only using 3 out of 5 metal layers). Due to the complexity of SoC design, a large number of components, and huge memory bandwidth requirements within a PIM, a complex on-chip interconnection is often needed to support the corresponding scalability. However, the increased scalability requirements typically bring significant pressures and difficulties for component and interconnect placements in conventional chip design and architecture approaches.

SUMMARY OF THE INVENTION

The systems and methods are configured to efficiently and effectively include processing capabilities in memory. In one embodiment, a processing in memory (PIM) chip comprises a memory array, logic components, and an interconnection network. The memory array is configured to store information. In one exemplary implementation, the memory array includes storage cells configured to store bits of information and array periphery components configured to control access to the storage cells. The storage cells are located in a first area (e.g., a first portion of the memory chip or die) and the array periphery components are located in a second area (e.g., second portion of the memory chip or die). The logic components are included in a third area (e.g., a third portion of the memory chip or die) and can be configured to process information stored in the memory array. The interconnection network is configured to communicatively couple the logic components. The interconnection network can include a first set of interconnect wires, and a portion of the first set of interconnect wires are located in a metal area above the memory array.

In one embodiment, the interconnection network includes switches configured to route information in the interconnection network. The switches can be included in an area with the array periphery components. In one exemplary implementation, the switches are included in a 2D PIM. The switches can be configured from otherwise redundant components in the array periphery components. In one embodiment, a second set of interconnect wires communicatively couple the storage cells and storage array periphery components. A portion of the second set of interconnection wires can be located in metal layers 1, 2, and 3, and a portion of the first set of interconnect wires can be located in metal layers 4 and 5. In one exemplary implementation, the memory is configured as a Dynamic Random Access Memory (DRAM). The array periphery components can include column address decoders configured to decode column addresses in the memory array and row address decoders configured to decode row addresses in the memory array.

In one embodiment, a processing in memory (PIM) chip fabrication process comprises forming a memory array in a memory array area of the PIM chip, forming logic components in a logic area of the PIM chip, and forming an interconnection network. The logic components can include processing components. The interconnection network includes interconnect wires, and a portion of the interconnect wires are located in a metal layer area that is located over the memory array area. Forming the interconnection network can include forming switches. The switches are coupled to the interconnect wires and are configured to route information between the logic components. In one exemplary implementation, a memory array area can include a memory cell portion and an array periphery portion. The switches can be located in the periphery component portion of the memory array area. The switches can include various components (e.g., multiplexers and de-multiplexers, buffers, the inverters, etc.). A portion of the interconnect wires for the logic components are located in metal layers 4 and 5 and a portion of other interconnect wires for the memory array are located in metal layers 1, 2, and 3.

In one embodiment, a memory comprises a memory block, logic components, and an interconnection network. The memory block is configured to store information. The logic components are configured to process information stored in the memory block. The interconnection network is configured to communicatively couple the logic components. In one embodiment, the interconnection network includes interconnect wires, and a portion of the interconnect wires are located in a metal area that is located over the memory block. The communication network can include switches in the memory block area and the switches are configured to route information in the interconnection network. The logic components can include a processing control component configured to perform various tasks (e.g., schedule tasks, configure registers, and handle global synchronization, an accelerator configured to accelerate application processing, etc.). The interconnection network can include an on-chip interconnection communicatively coupling accelerators to Dynamic Random Access Memory (DRAM) blocks and allowing access with relatively high latency compared to dedicated DRAM blocks. The interconnection network can include a dedicated interface between accelerators and DRAM blocks enabling high bandwidth and low latency DRAM access from the corresponding accelerator with a higher priority than other blocks. In one exemplary implementation, the interconnection network includes an on-chip interconnection that forms a network on-chip (NoC) with varied topologies.

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The accompanying drawings, which are incorporated in and form a part of this specification, are included for exemplary illustration of the principles of the present invention and are not intended to limit the present invention to the particular implementations illustrated therein. The drawings are not to scale unless otherwise specifically indicated. Embodiments of the present technology are illustrated by way of example and not by way of limitation, in the figures of the accompanying drawings and in which like reference numerals refer to similar elements. The drawings are not necessarily to scale unless otherwise indicated.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the phraseology and terminology used herein is for the purpose of description and should not be regarded as limiting.

The systems and methods facilitate efficient and effective communication and processing of information in memory. In one embodiment, processing components and memory components can be included in the same semiconductor chip (e.g., DRAM, etc.). In one exemplary implementation, there is an on-chip interconnect architecture coupling on-chip processing components to other components in the chip. The on-chip interconnect architecture can include an interconnection network configured to enable improved communication between on-chip components. The interconnection network can include communication wires and switches. The interconnection network can include global routing in the upper metal layers on top of DRAM arrays and switching/routing logic in DRAM array areas.

In one embodiment, an interconnection network communicatively couples on-chip processing components to other components on the chip. In one exemplary implementation, the communication network communicatively couples an on-chip processing component to an on-chip accelerator component. Portions of the interconnect wires can be located in top metal layers of a DRAM fabrication process. The interconnect wires can be coupled to the top layers through vias. In one embodiment, portions of the interconnect wires use upper metal layers (e.g., M4, M5, etc.) in areas that are above areas of the PIM chip that include memory block components. The area of the PIM chip that includes the memory block components includes memory array components and array periphery components. The area of the PIM chip that includes the memory block components can also include other components (e.g. buffer, inverters, MUXs, DeMUXs, etc.) associated with interconnection network operations.

The components associated with interconnection network operations can include communication repeater logic components, switches for global routing (e.g. on-chip interconnection, etc.), and so on. In one exemplary implementation, the booster/repeating components and switches/routers can be included in DRAM array/peripheral areas. The switches can be configured to route the data through on-chip connections from initiators/source to targets/destination with varied topologies of interconnection. In one embodiment, memory array block interconnections are located in lower metal layers (e.g., M1, M2, M3, etc.) of a DRAM fabrication process. In one exemplary implementation, the memory array block interconnects are located in a lower three metal layers and the on-chip processing interconnects are located in an upper two metal layers.

The top metal layers can provide routing configurations that facilitate strengthening the driving power and boosting the electronic current (e.g., so that the timing and performance is improved, etc.). The interconnection network can improve the architecture scalability, timing, and performance. In one embodiment, area overhead is incurred in DRAM blocks but the available routing space is significantly increased.

Figure 1:
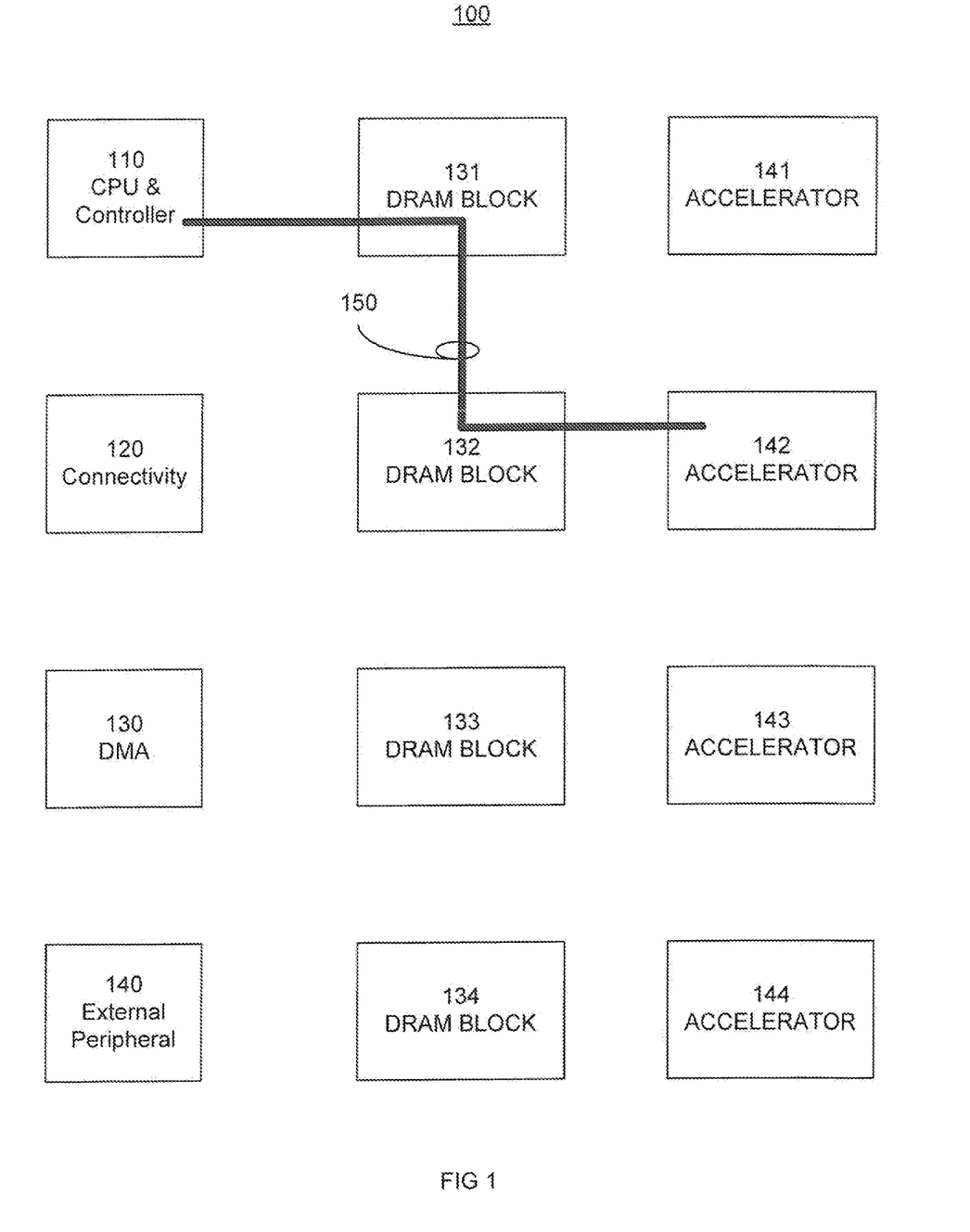
FIG. 1 is a block diagram of an exemplary memory system with a portion of the interconnection network located in an area above memory array components in accordance with one embodiment.

FIG. 1 is a block diagram of memory system 100 in accordance with one embodiment. Memory system 100 includes CPU and controller 110, connectivity component 120, direct memory access (DMA) 130, external peripheral components 140, DRAM blocks 131, 132, 133, and 134, and accelerators 141, 142 143, and 144. Memory system 100 also includes network interconnect wires that communicatively couple CPU and controller 110 to the accelerators 141, 142, 143, and 144. In one exemplary implementation, interconnect wire 150 communicatively couples CPU and controller 110 to accelerator 142. A portion of the interconnect wire 150 is located in metal layers above a portion of the area in which the DRAM block 131 and DRAM block 132 are located.

The components of memory system 100 cooperatively operate to store information and provide on-chip processing of some of the information. In one embodiment, the on-chip processing is considered processing in memory (PIM). Central processing unit (CPU) 110 and controller 110 direct various control operations (e.g., including scheduling tasks, configuring registers, handling global synchronization, etc.). The accelerators 141 through 144 accelerate operations associated with various applications (e.g., like Deep Neural Networks (DNNs), etc.). The DRAM blocks 131 through 134 selectively store information. The DRAM blocks can provide high bandwidth, high capacity, and low latency access. The connectivity components 120 are configured to interface with a Host (e.g., when the memory chip acts as an accelerator in a cloud, etc.). The connectivity components 120 can be compatible with various protocols and configurations (e.g. PCIe, DDR4, etc.). The external peripheral interface components 140 are configured to interface with external peripherals via various protocols (e.g., such as 2C, I2S, UART, USB, etc.). The DMA components 130 are configured to manage data transfers for on-chip interconnections to free the CPU 110 and accelerators 141 through 144 to execute other computation related workload.

In one embodiment, memory system 100 is a two-dimensional processing in memory system on a chip (2D PIM SoC). It is appreciated that other components (not shown) can be included in the 2D PIM SoC (e.g., vector processor, video codec, audio DSP, etc.) depending on the application needs.

The interconnection network can include communication booster or repeating logic components (e.g., buffers, inverters, etc.) in a DRAM array or DRAM array peripheral logic component areas. In one exemplary implementation, data repeating logic components are included in global routing connection path data lanes or interconnect wires.

The interconnection network can include switches/routers. The switches/routers can use multiplexers/de-multiplexers and FIFOs included in DRAM array areas or DRAM peripheral logic areas. In one embodiment, switches/routers route the data through on-chip connections from initiators/sources to targets/destinations with varied topologies of interconnection.

Figure 2:
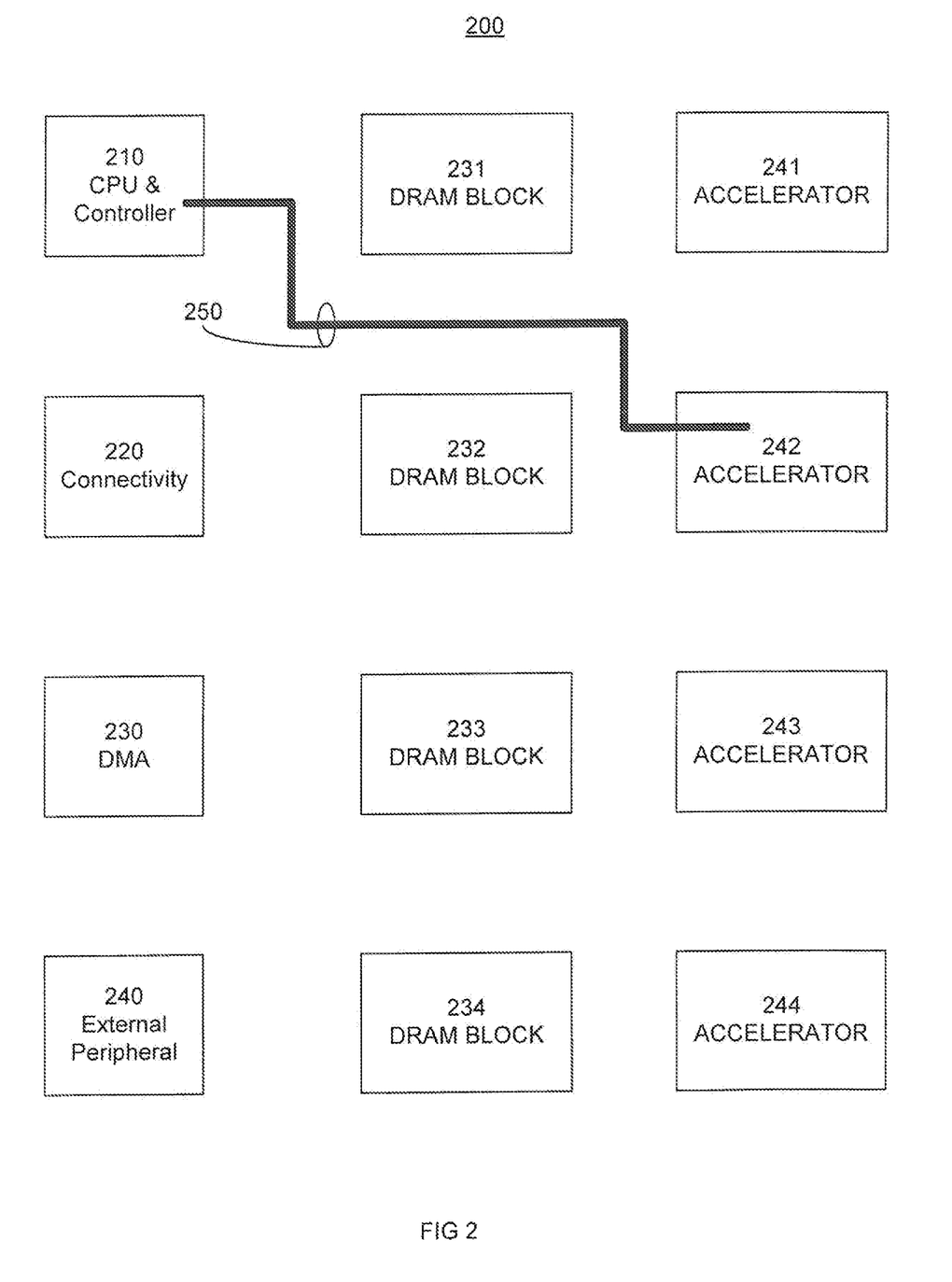
FIG. 2 is a block diagram of an exemplary memory system with a portion of the interconnection network located in an area not above memory array components in accordance with one embodiment.

FIG. 2 is a block diagram of memory system 200 in accordance with one embodiment. Memory system 200 is similar to memory system 100 except the interconnection network lines and switches are located in areas that are not above the DRAM block locations. Memory system 200 includes CPU and controller 210, connectivity component 220, direct memory access (DMA) 230, external peripheral components 240, DRAM blocks 231, 232, 233, and 234, and accelerators 241, 242 243, and 244. Memory system 200 also includes interconnection network wires that communicatively couple CPU and Controller 210 to the accelerators 241, 242, 243, and 244. In one exemplary implementation, interconnect wire 250 communicatively couples CPU and controller 210 to accelerator 242. The interconnect wire 250 is located in metal layers not above the DRAM block 231 and DRAM block 232 are located.

Figure 3:
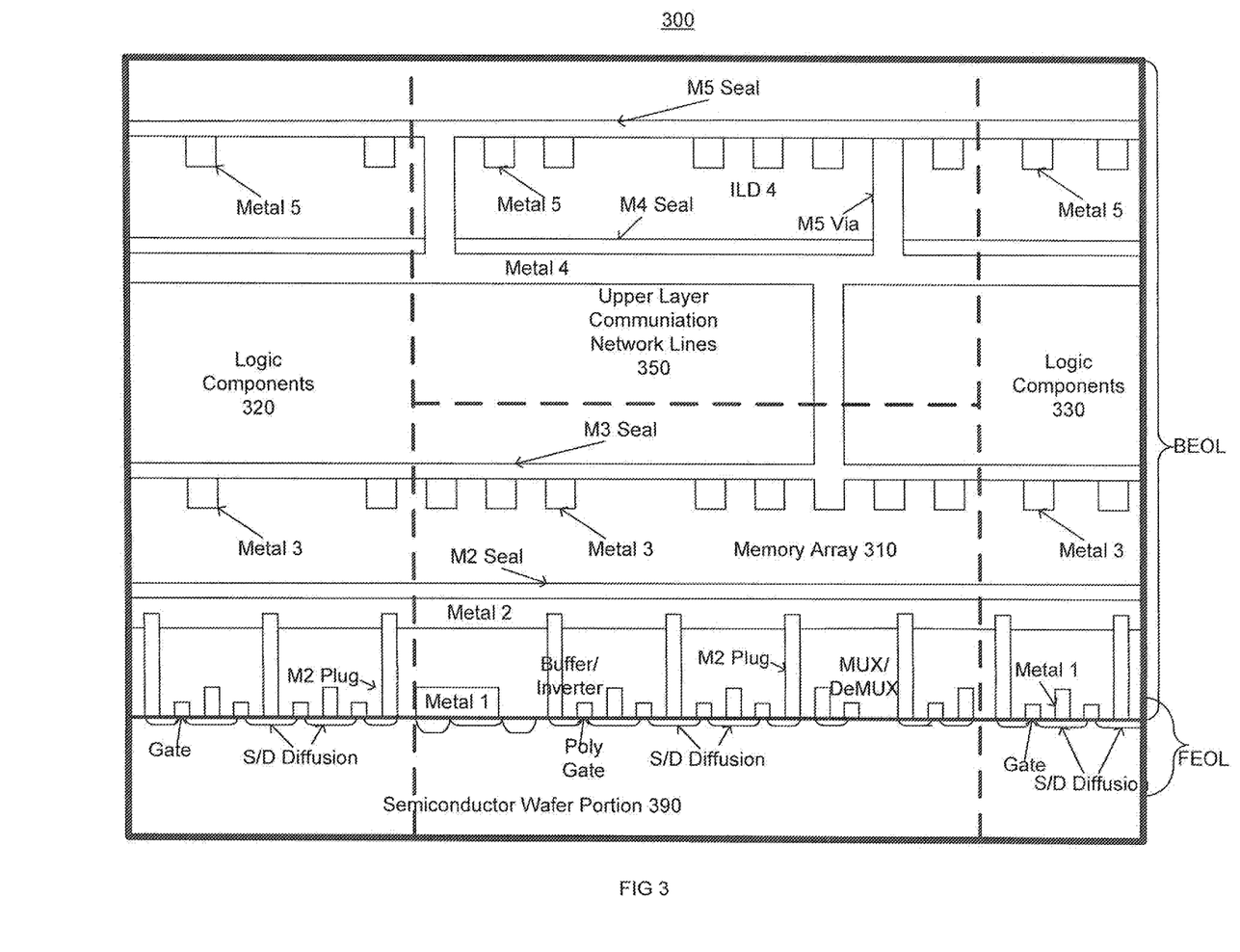
FIG. 3 is a cut out side view block diagram of an exemplary memory system with a portion of the interconnection network located in an area above memory array components in accordance with one embodiment.

FIG. 3 is a sideview block diagram of a memory 300 in accordance with one embodiment. Memory 300 includes memory array area 310, logic component area 320, logic component area 330, and upper layer interconnection network area 350. In one embodiment, upper layer interconnection network area 350 includes interconnect wires. A portion of the interconnect wires is included in metal layer 4 and metal layer 5 in an area above the memory array area 310. The interconnect wires communicatively couple a portion of logic components 320 to a portion of logic components 330. In one exemplary implementation, respective portions of metal layer 2 and metal layer 3 that are in an area over logic components 320 and 330 communicatively couple components included in logic components 320 and 330, and portions of metal layer 2 and metal layer 3 that are in an area over memory array 310 communicatively couple components included in memory array 310.

Figure 4:
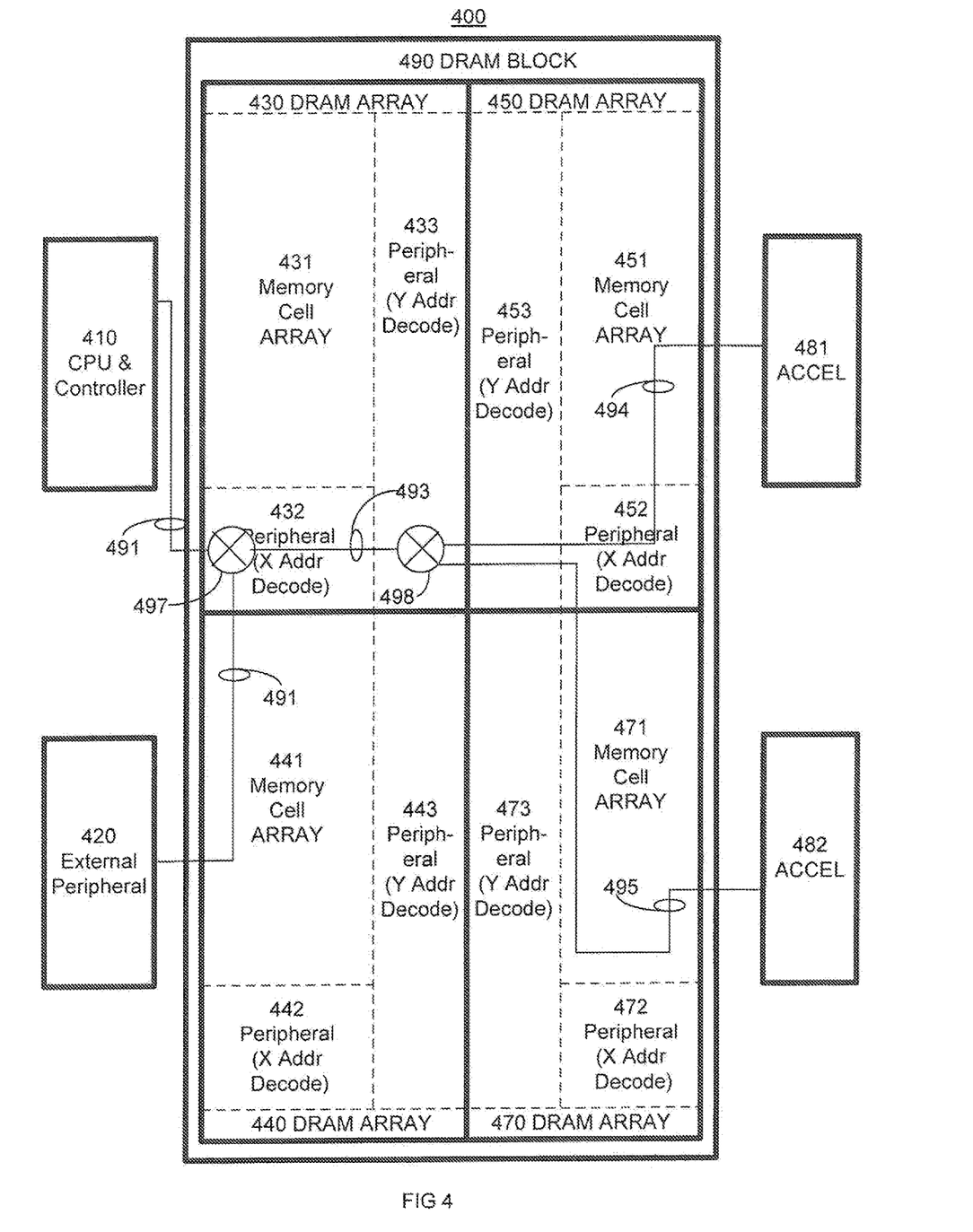
FIG. 4 is top view block diagram of an exemplary memory system with a portion of the interconnection network located in an area above memory array components in accordance with one embodiment.

FIG. 4 is a block diagram of memory system 400 in accordance with one embodiment. Memory system 400 includes CPU and controller 410, external peripheral components 320, DRAM arrays 430, 440, 450, and 470, and accelerators 481 and 482. The DRAM arrays 430, 440, 450, and 470, include arrays of memory cells and array periphery components. The memory arrays include information storage cells that selectively retain characteristics or properties corresponding to logical values associated with the information. The periphery components include column address decoders configured to decode column or X dimension/axis addresses of the array and row address decoders configured to decode row or Y dimension/axis addresses of the array.

DRAM array 430 includes memory cell array 411, column or X array dimension address decoder 432, and row or y array dimension address decoder 433. DRAM array 440 includes memory cell array 441, column or X array dimension address decoder 442, and row or y array dimension address decoder 443. DRAM array 450 includes memory cell array 451, column or X array dimension address decoder 452, and row or y array dimension address decoder 453. DRAM array 470 includes memory cell array 471, column or X array dimension address decoder 472, and row or y array dimension address decoder 473.

The interconnection network can include interconnect wires and switches. The switches can be located in the array peripheral area. In one embodiment, a portion of the interconnect wires are located in an area above the array peripheral area and a portion of the interconnect wires are located in an area above the memory cell array area.

Memory system 400 also includes an interconnection network that communicatively couples CPU and controller 410 to the accelerators 481 and 482. The interconnection network includes interconnect wires 491, 492, 493, 494, and 495, and switches 497 and 498. Interconnect wire 491 is communicatively coupled to CPU and controller 410 and switch 497, which in turn is communicatively coupled to external peripheral components 420 and interconnect wire 493. Interconnect wire 493 is communicatively coupled to switch 497 which is communicatively coupled to interconnect wires 494 and 495. Interconnect wire 494 is communicatively coupled to arbiter 481. Interconnect wire 495 is communicatively coupled to arbiter 482.

In one embodiment, switches in memory system 400 are formed in areas including array periphery components (e.g., array address decoding components, etc.). Switch 497 is located in a column or X array dimension address decoder area 432. Switch 498 is located in a row or y array dimension address decoder area 433.

In one embodiment, interconnect wires can be located in metal layers above areas that include memory array components. A portion of interconnect wire 491 is located in a metal layer above array peripheral component area 432. A portion of interconnect wire 492 is located in a metal layer above array peripheral component area 432 and a portion is located in a metal layer above memory cell area 441. A portion of interconnect wire 493 is located in metal layers above array peripheral component area 432 and a portion of interconnect wire 493 is located in metal layers above the above array peripheral component area 433. Respective portions of interconnect wire 494 are located in metal layers above array peripheral component area 433, array peripheral component area 453, array peripheral component area 452, and memory cell array 451. Respective portions of interconnect wire 495 are located in metal layers above array peripheral component area 433, array peripheral component area 453, array peripheral component area 452, memory cell array 471, and array peripheral component area 472.

Figure 5:
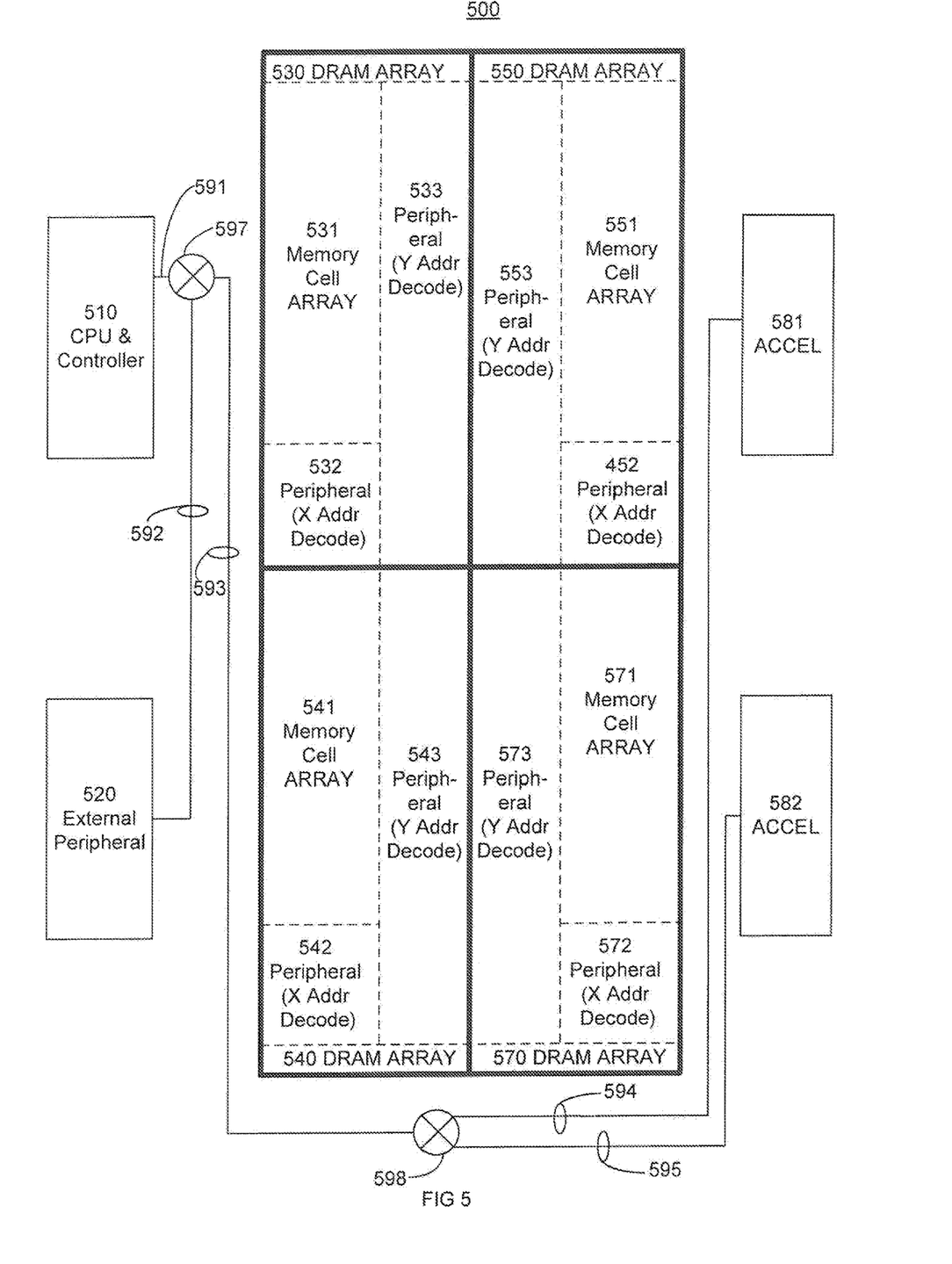
FIG. 5 is top view block diagram of an exemplary memory system with a portion of the interconnection network located in an area not above memory array components in accordance with one embodiment.

It is appreciated that alternate configurations can be implemented. In one embodiment, it is not convenient to include network switches in array periphery areas and the interconnect wires are not located above the memory array components. FIG. 5 is a block diagram of memory system 500 in accordance with one embodiment. Memory system 500 is similar to memory system 500 except the interconnection network wires and switches are located in areas that are not above the DRAM block locations. Memory system 500 includes CPU and controller 510, external peripheral components 520, DRAM arrays 530, 540, 550, and 570, and accelerators 581 and 582. The DRAM arrays 530, 540, 550, and 570, include arrays of memory cells and array periphery components. DRAM array 530 includes memory cell array 511, column or X array dimension address decoder 532, and row or y array dimension address decoder 533. DRAM array 540 includes memory cell array 541, column or X array dimension address decoder 542, and row or Y array dimension address decoder 543. DRAM array 550 includes memory cell array 551, column or X array dimension address decoder 552, and row or Y array dimension address decoder 553. DRAM array 570 includes memory cell array 571, column or X array dimension address decoder 572, and row or y array dimension address decoder 573.

Memory system 500 also includes an interconnection network that communicatively couples CPU and controller 510 to the accelerators 581 and 582. The interconnection network includes interconnect wire 591, 592, 593, 594, and 595, and switches 597 and 598. Interconnect wire 591 is communicatively coupled to CPU and controller 510 and switch 597, which in turn is communicatively coupled to external peripheral components 520 and interconnect wire 593. Interconnect wire 593 is communicatively coupled to switch 497 which is communicatively coupled to interconnect wires 594 and 595. Interconnect wire 594 is communicatively coupled to arbiter 581. Interconnect wire 595 is communicatively coupled to arbiter 582. The interconnect wire 591, 592, 593, 594, and 595 can be located in metal layers above areas that do not include memory array components. Switches 507 and 598 can be included in areas other than the memory array areas (e.g., logic component areas, etc.). In one embodiment, an interconnect wire is a conductive trace or line in a metal layer of a semiconductor chip.

It is appreciated that interconnection networks can included various configurations. In one embodiment, an interconnection network includes interconnect wires and switches (e.g., similar to memory system 400, 500, etc.). In one exemplary implementation, the some of the interconnect wires are included in metal layer areas above a memory array area and some of the interconnect wires are included in other metal layer areas (e.g., not above a memory array area, etc.). Similarly, some of the interconnect network switches can be included in the array peripheral area and some of the interconnect network switches can be included in other areas (e.g., non-memory array areas, logic component areas, etc.).

Figure 6:
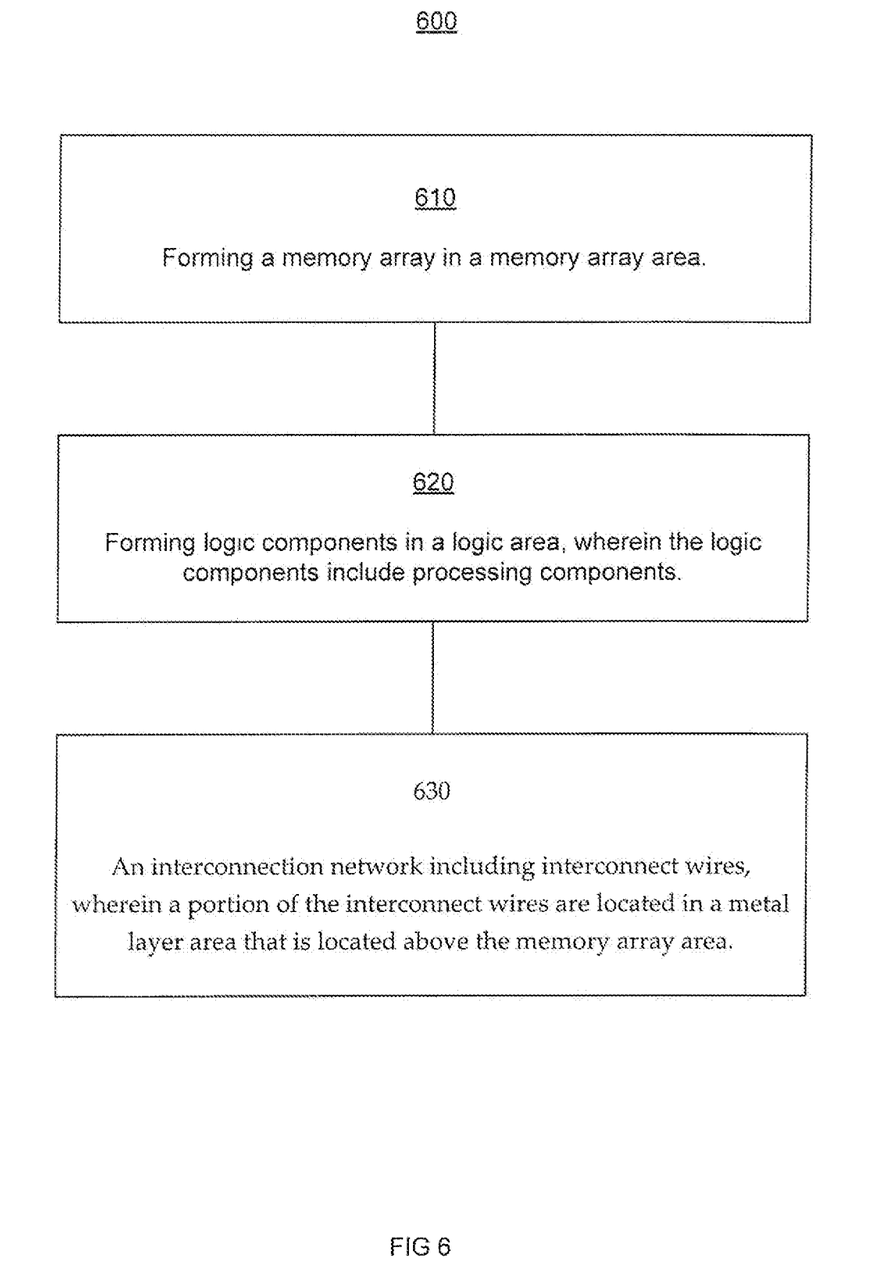
FIG. 6 is a flow chart of an exemplary memory fabrication method in accordance with one embodiment.

FIG. 6 is a flow chart of memory fabrication method 600 in accordance with one embodiment.

In block 610, a memory array is formed in a memory array area. In one embodiment, the memory array area includes a memory cell portion and a periphery portion.

In block 620, logic components are formed in a logic area. In one embodiment, the logic components include processing components.

In block 630, a interconnection network including interconnect wires, wherein a portion of the interconnect wires are located in a metal layer area that is located above the memory array area. Forming the interconnection network can include forming switches. The switches can be coupled to the interconnect wires and can be configured to route information between the logic components. The switches can be located in the periphery component portion of the memory array area. The switches can include various components (e.g., multiplexers, de-multiplexers, buffers, inverters, etc.). A portion of interconnect wires for the memory array can be located in metal layers 1, 2, and 3, and a portion of interconnect wires for the logic components can be located in metal layers 4 and 5.

Figure 7:
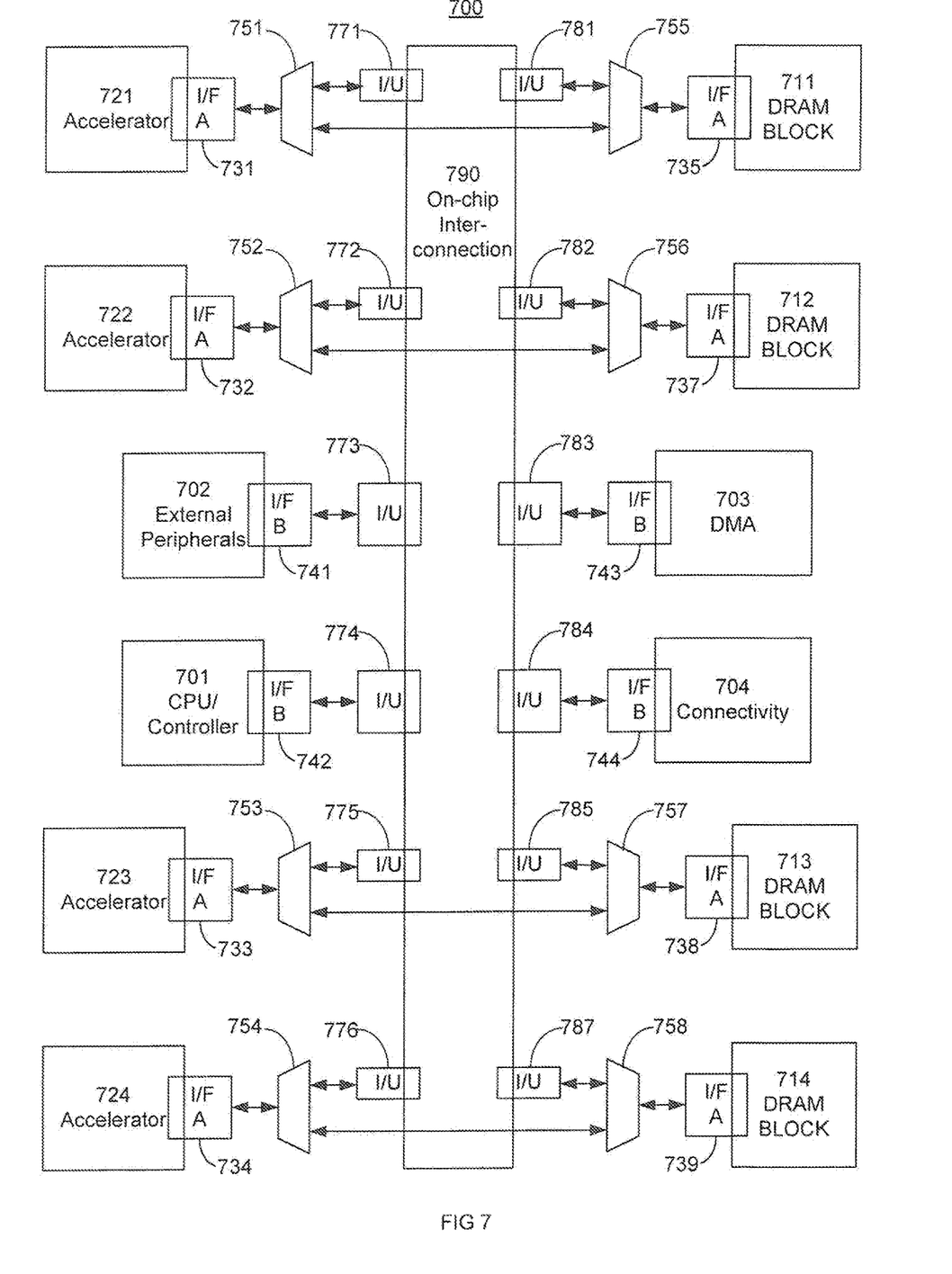
FIG. 7 is a block diagram of an exemplary memory interconnection architecture in accordance with one embodiment.

FIG. 7 is a block diagram of memory 700 in accordance with one embodiment. Memory system 700 includes CPU and controller 701, external peripheral components 702, direct memory access (DMA) 703, connectivity component 704, DRAM blocks 711, 712, 713, and 714, and accelerators 121, 122 123 and 124. Memory system 700 also includes an interconnection network including on-chip interconnection components 790 (e.g., interconnect wires, routing switches, etc.). The on-chip interconnection components 790 are communicatively coupled to the other components of memory. The on-chip interconnection components 790 can allow accelerators to access other on-chip components with relative high latency compared to dedicated DRAM component. In one exemplary implementation, the on-chip interconnection components 790 allows varied masters (e.g., CPU, accelerator, DMA, etc.) to access varied slaves like DRAM and peripheral components. The on-chip interconnection components 790 can be a part of a Network on-Chip (NoC) with varied topologies (e.g., crossbar, bus protocols, multi-stage/multi-level bus/NoC, etc.). The on-chip interconnection components 790 can include arbiters to guarantee an accelerator has the highest priority to access a dedicated DRAM block.

The interconnection network can include dedicated 1-2-1 interfaces (I/F A) (e.g., 731, 732, 733, 734, 735, 737, 738, and 739) between the accelerators and DRAM blocks. In one embodiment, the dedicated interfaces guarantee a high bandwidth & low latency DRAM access from the corresponding accelerator. The dedicated interfaces can have higher priority than other blocks. In one exemplary implementation, the dedicated interfaces (e.g., I/F A, etc.) can be compliant with various protocols (e.g. AXI, AHB, OCP, even customized protocols, etc.) Another form of interface (e.g., 741, 742, 743, and 744) can be used to connect various components (e.g., CPU/Control 702, DMA 703, etc.). The other forms of interface (e.g., I/F B) can be the same or different for different components depending on the individual component design (e.g. APB for Peripherals, AHB-lite for CPU, etc.).

The interconnection network can include interface units (IUs). Memory 700 includes interface units 771, 772, 773, 774, 775, 776, 781, 782, 783, 784, 785, and 787. The IUs can be utilized to facilitate coupling of various other interface components (e.g., 731, 733, 741, 757, etc.) to the on-chip interconnection components 790. In one embodiment, the interface units convert signals from other components to the internal protocol or the interconnection component 790 (e.g., like packet protocol for NoC or AHB-lite, pass through, AHB IF connects to an AHB bus matrix, etc.).

Figure 8:
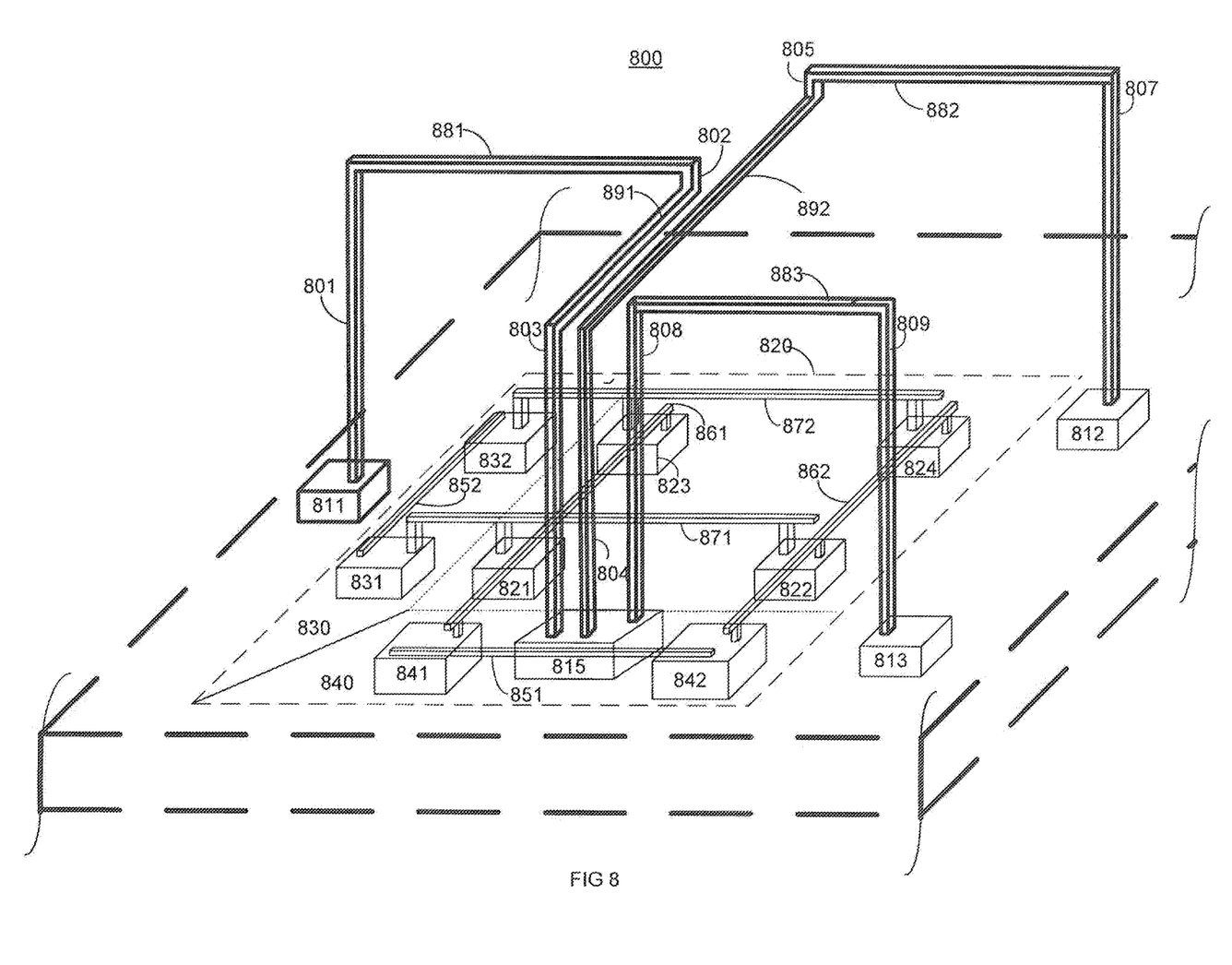
FIG. 8 is a block diagram of an exemplary portion of a PIM chip in accordance with one embodiment.

FIG. 8 is a block diagram of an exemplary portion of PIM chip 800 in accordance with one embodiment. PIM chip 800 includes processing components 811, 812, and 813 in a location or area 810 that is not part of memory array area 820. In one exemplary implementation memory array area 820 is associated with a memory block. Memory array area 820 includes memory array peripheral area 830, memory array peripheral area 840, and memory array cells 821, 822, 823, and 824. In one embodiment memory array peripheral area 830 includes row address decode components 831 and 832, and memory array peripheral area 840 includes column address decode components 841 and 842. The processing components 811, 812, and 813, memory array cells 821, 822, 823, and 824, row address decode components 831 and 832, and column address decode components 841 and 842 can be formed as part of front-end-of-line fabrication processes.

PIM chip 800 includes interconnections. In one embodiment, the primary memory components memory array cells 821, 822, 823, and 824, row address decode components 831 and 832, and column address decode components 841 and 842 are coupled be interconnects in lower metal layers. Row address decode components 831 and 832 are coupled by interconnect 852. Column address decode components 841 and 842 are coupled by interconnect 851. Interconnect 852 and 851 are located in metal layer 1. Column address decode component 841 is communicatively coupled to memory cells 821 and 822 by interconnect 861 and column address decode component 842 is communicatively coupled to memory cells 823 and 824 by interconnect 862. Interconnects 861 and 862 are in the metal layer 2. Row address decode component 831 is communicatively coupled to memory cells 821 and 822 by interconnect 871 and row address decode component 832 is communicatively coupled to memory cells 823 and 824 by interconnect 872. Interconnect 871 and 872 are in metal layer 3. It is appreciated vias couple the device components (e.g., processing component 811, memory array cell 821, row address decode components 832, etc.) to metal layers 2 and above.

PIM chip 800 also include an interconnection network for processing components 811, 821, and 831. The interconnection network includes interconnects 881, 882, and 883, interconnects 891 and 892, vias 801 through 809, and routing component or switch 815. Processing component 811 is coupled to switch 815 by via 801, interconnect 881, via 802, interconnect 891, and via 803. Processing component 812 is coupled to switch 815 by via 807, interconnect 882, via 805, interconnect 892, and via 804. Processing component 813 is coupled to switch 815 by via 809, interconnect 883, via 808. Interconnects 891 and 892 are located in metal layer 4 and interconnects 881, 882, and 883 are located in metal layer 5. A portion of interconnects 891, 892, 881, 882, and 883 are located above memory array area 820. Switch 813 is located in column address decode area 840.

Figure 9:
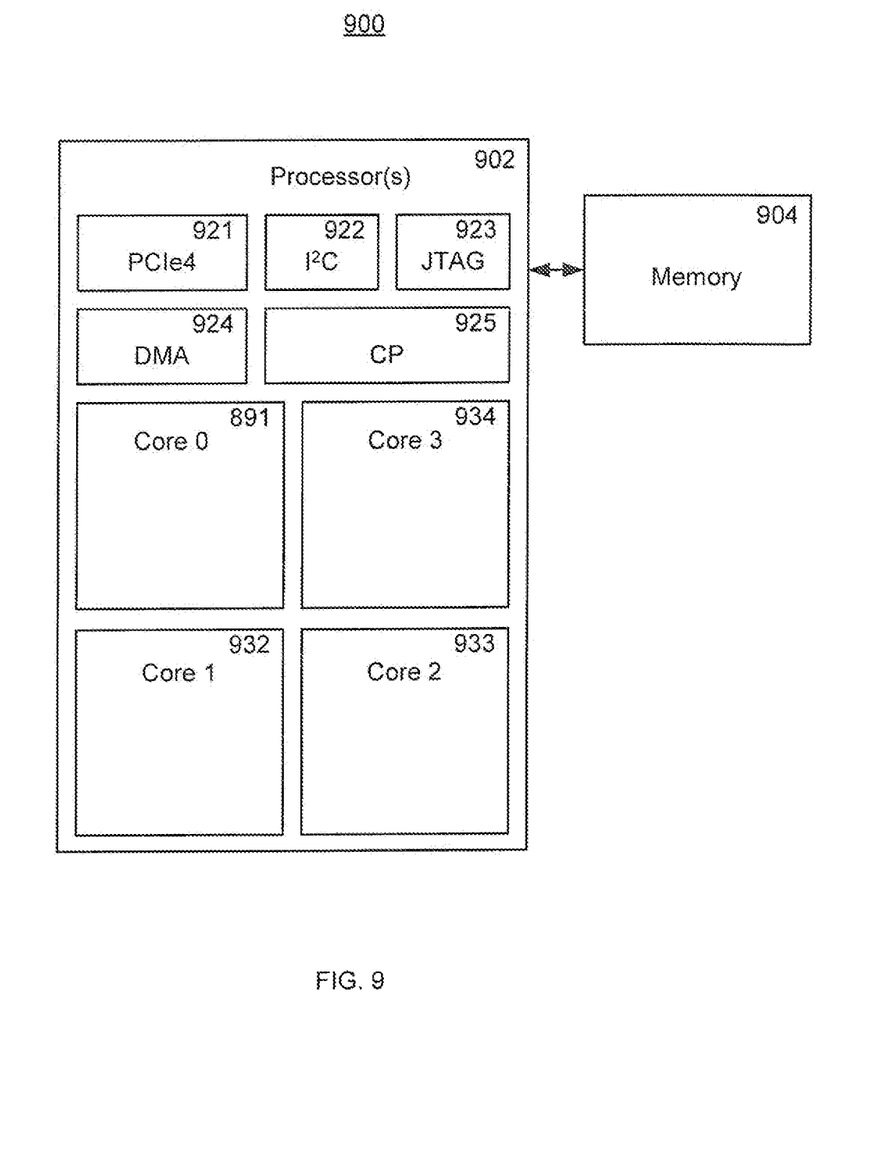
FIG. 9 is a block diagram of an exemplary computing system for storing and processing information in accordance with one embodiment.

FIG. 9 is a block diagram of an exemplary computing system 900 for storing and processing information in accordance with one embodiment. In one embodiment, a PIM chip is included in memory 904 (e.g., similar to memory system 100, 200, 400, 800, etc.). The computing system 900 can include processors 902 and memory 904. In one implementation, the computing system 900 can be a server computer, a data center, a cloud computing system, a stream service system, an internet service provider system, a cellular service provider system, or the like. The processors 902 can be central processing units (CPU), graphics processing units (GPU), neural processing units (NPU), vector processors, memory processing units, or the like, or combinations thereof. In one implementation, a processor 902 can include communication interfaces, such as peripheral component interface (PCIe4) 921 and inter-integrated circuit (I2C) interface 933, an on-chip circuit tester, such as a joint test action group (JTAG) engine 923, a direct memory access engine 924, a command processor (CP) 925, and cores 931-934. The cores 931-934 can be coupled in a direction ring bus configuration.

Referring still to FIG. 9, the cores 931-934 can execute sets of computing device executable instructions to perform functions including, but not limited to performing a narrow channel conversion memory control method. The functions can be performed on individual core 931-934, can be distributed across a plurality of cores 931-934, can be performed along with other functions on cores, and or the like.

Figure 10:
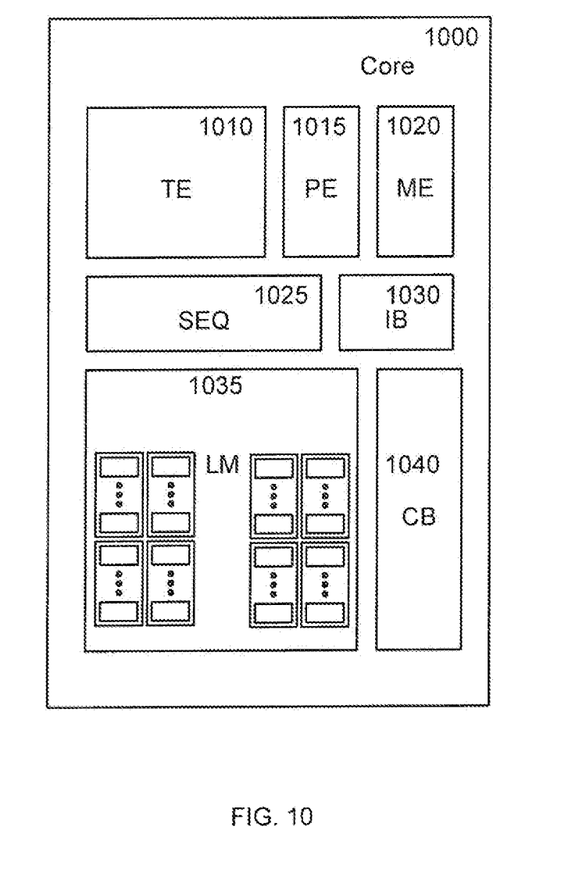
FIG. 10 is a block diagram of an exemplary processing core configuration in accordance with one embodiment.

FIG. 10 is a block diagram of an exemplary processing core configuration 1000 in accordance with one embodiment. In one embodiment, components of processing core configuration 1000 participate in a PIM operation. The processing core 1000 can include a tensor engine (TE) 1010, a pooling engine (PE) 1015, a memory copy engine (ME) 1020, a sequencer (SEQ) 1025, an instructions buffer (IB) 1030, a local memory (LM) 1035, and a constant buffer (CB) 1040. The local memory 1035 can be pre-installed with model weights and can store in-use activations on-the-fly. The constant buffer 1040 can store constant for batch normalization, quantization and the like. The tensor engine 1010 can be utilized to accelerate fused convolution and or matrix multiplication. The pooling engine 1015 can support pooling, interpolation, region-of-interest and the like operations. The memory copy engine 1020 can be configured for inter- and or intra-core data copy, matrix transposition and the like. The tensor engine 1010, pooling engine 1015, and memory copy engine 1020 can run in parallel. The sequencer 10210 can orchestrate the operation of the tensor engine 1010, the pooling engine 1015, the memory copy engine 1020, the local memory 10310, and the constant buffer 1040 according to instructions from the instruction buffer 1030. The processing core 1000 can provide video coding efficient computation under the control of operation fused coarse-grained instructions. A detailed description of the exemplary processing unit core 1000 is not necessary to an understanding of aspects of the present technology, and therefore will not be described further herein.

In one embodiment, the PIM systems and methods can boost the clock frequency and performance of logic blocks. Locating communication switches in array periphery areas and interconnection interconnect wires in upper metal layers above the memory array areas enables improved design scalability, improved routing timing, reduced routing area, and reduced power consumption. The memory interconnection architecture can facilitate utilization of more metal layers for local routing and have a higher utilization ratio. It is appreciated the presented two-dimensional processing-in-memory (2D PIM) architecture can be utilized in various application environments (e.g., Edge computing environments, Cloud computing environments, etc.).

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A processing in memory (PIM) chip comprising:
a memory array configured to store information, wherein the memory array includes:
storage cells, and
array periphery components configured to control access to the storage cells;
logic components configured to process information stored in the memory array, wherein a portion of the logic components are included in a layer with a portion of the memory array; and
an interconnection network configured to communicatively couple the logic components, wherein the interconnection network includes a first set of interconnect wires, and a portion of the first set of interconnect wires are located in a metal area above the memory array, wherein the interconnection network includes switches in an area with the array periphery components and the switches are configured to route information in the interconnection network.

2. The memory of claim 1, wherein the switches are coupled to the interconnect wires and are configured to route information between the logic components.

3. The memory of claim 2, wherein the logic components comprise:
a processing control component configured to schedule tasks, configure registers, and handle global synchronization; and
an accelerator configured to accelerate application processing.

4. The memory of claim 1, wherein the switches are configured from otherwise redundant components in the array periphery components.

5. The memory of claim 1, wherein a second set of interconnect wires communicatively couple the storage cells and storage array periphery components, wherein a portion of the second set of interconnect wires are located in metal layers 1, 2, and 3, and a portion of the first set of interconnect wires for the logic components are located in metal layers 4 and 5.

6. The memory of claim 1, wherein the memory is configured as a Dynamic Random Access Memory (DRAM).

7. The memory of claim 1, wherein the array periphery components include column address decoders configured to decode column addresses in the memory array and row address decoders configured to decode row addresses in the memory array.

8. A processing in memory (PIM) chip fabrication process comprising:
forming a memory array in a memory array area of the PIM chip;
forming logic components in a logic area of the PIM chip, wherein the logic components include processing components, wherein a portion of the logic components are included in a layer with a portion of the memory array; and
forming an interconnection network including interconnect wires and switches configured to route information, wherein a portion of the interconnect wires are located in a metal layer area that is located above the memory array area, wherein the memory array area includes a memory cell portion and a memory array periphery component portion and the switches are located in the memory array periphery component portion of the memory array area.

9. The memory fabrication process of claim 8, wherein the switches are coupled to the interconnect wires and are configured to route information between the logic components.

10. The memory fabrication process of claim 9, wherein the logic components comprise:
   a processing control component configured to schedule tasks, configure registers, and handle global synchronization; and
an accelerator configured to accelerate application processing.

11. The memory fabrication process of claim 9, wherein the switches include multiplexers and de-multiplexers.

12. The memory fabrication process of claim 9, wherein the switches include buffers.

13. The memory fabrication process of claim 9, wherein the switches include inverters.

14. The memory fabrication process of claim 9, wherein a portion of the interconnect wires for the logic components are located in metal layers 4 and 5 and a portion of other interconnect wires for the memory array are located in metal layers 1, 2, and 3.

15. A processing in memory (PIM) chip comprising:
   a memory block configured to store information;
   logic components configured to process information stored in the memory block, wherein a portion of the logic components are included in a layer with a portion of the memory block; and
   an interconnection network configured to communicatively couple the logic components, wherein the communication network includes interconnect wires, and a portion of the interconnect wires are located in a metal area that is located over the memory block, wherein the interconnection network includes switches in the memory block area and the switches are configured to route information in the interconnection network.

16. The memory of claim 15, wherein the switches are configured to route information between the logic components.

17. The memory of claim 15, wherein the logic components comprise:
   a processing control component configured to schedule tasks, configure registers, and handle global synchronization; and
   an accelerator configured to accelerate application processing.

18. The memory of claim 15, wherein the interconnection network includes on-chip interconnect wires communicatively coupling accelerators to Dynamic Random Access Memory (DRAM) blocks and allowing access with relative high latency compared to dedicated DRAM blocks.

19. The memory of claim 15, wherein the interconnection network includes a dedicated interface between accelerators and DRAM blocks enabling high bandwidth and low latency DRAM access from the corresponding accelerator with a higher priority than other blocks.

20. The memory of claim 15, wherein the interconnection network includes an on-chip interconnection that forms a network on-chip (NoC) with varied topologies.

\* \* \* \* \*